US010219387B2

(12) United States Patent
Zhang et al.

(10) Patent No.: US 10,219,387 B2
(45) Date of Patent: Feb. 26, 2019

(54) PROCESS FOR MANUFACTURING A PRINTED CIRCUIT BOARD HAVING HIGH DENSITY MICROVIAS FORMED IN A THICK SUBSTRATE

(71) Applicant: NVIDIA Corporation, Santa Clara, CA (US)

(72) Inventors: Leilei Zhang, Sunnyvale, CA (US); Ronilo V. Boja, Gilroy, CA (US); Abraham Fong Yee, Cupertino, CA (US); Zuhair Bokharey, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 1211 days.

(21) Appl. No.: 13/754,799

(22) Filed: Jan. 30, 2013

(65) Prior Publication Data

US 2014/0208590 A1    Jul. 31, 2014

(51) Int. Cl.
  *H05K 3/00*    (2006.01)
  *H05K 3/42*    (2006.01)
(52) U.S. Cl.
  CPC ......... *H05K 3/0094* (2013.01); *H05K 3/0032* (2013.01); *H05K 3/0047* (2013.01); *H05K 3/42* (2013.01); *H05K 2201/0959* (2013.01); *H05K 2201/09827* (2013.01); *H05K 2201/09854* (2013.01); *H05K 2203/1476* (2013.01); *H05K 2203/1572* (2013.01); *Y10T 29/49165* (2015.01)

(58) Field of Classification Search
  CPC ............ Y10T 29/49165; H05K 3/0047; H05K 3/0055; H05K 3/0094; H05K 3/0035; H05K 2203/108; H05K 3/0032–3/0038; H05K 3/005
  See application file for complete search history.

(56) References Cited

U.S. PATENT DOCUMENTS

| 5,363,553 | A | * | 11/1994 | Edwards | .................. | H05K 3/44 |
| | | | | | | 174/262 |
| 2007/0227766 | A1 | * | 10/2007 | Ito | .......................... | B23B 51/02 |
| | | | | | | 174/261 |
| 2008/0127484 | A1 | * | 6/2008 | Tourne | ........................... | 29/830 |

FOREIGN PATENT DOCUMENTS

CN    101409982 A  *  4/2009

OTHER PUBLICATIONS

CN 101409982 A machine translation, obtained May 4, 2015.*

* cited by examiner

*Primary Examiner* — Livius Radu Cazan
(74) *Attorney, Agent, or Firm* — Zilka-Kotab, P.C.

(57) ABSTRACT

A process for manufacturing a printed circuit board having high-density microvias formed in a thick substrate is disclosed. The method includes the steps of forming one or more holes in a thick substrate using a laser drilling technique, electroplating the one or more holes with a conductive material, wherein the conductive material does not completely fill the one or more holes, and filling the one or more plated holes with a non-conductive material.

22 Claims, 6 Drawing Sheets

PROCESS FOR MANUFACTURING A PRINTED CIRCUIT BOARD HAVING HIGH DENSITY MICROVIAS FORMED IN A THICK SUBSTRATE

FIELD OF THE INVENTION

The present invention relates to manufacturing processes for creating printed circuit boards, and more particularly to techniques for forming high density plated through holes in thick substrates.

BACKGROUND

Current techniques for forming plated through holes (i.e., vias) in a printed circuit board substrate include mechanical drilling with a resin fill or laser drilling with a copper fill. Mechanical drilling methods are typically limited to applications with hole diameters of 100 μm or larger because mechanical drill bits tend to break at hole diameters smaller than 100 μm. For applications with hole diameters less than 100 μm, laser drilling technique are preferred. However, laser drilling techniques are typically limited to applications implemented with thin substrates because conventional laser drilling techniques have poor results forming deep holes. For example, the laser drilling process may be prone to various issues with substrate thicknesses greater than approximately 200 μm. One such issue is necking of the hole (i.e., decreasing diameter of the hole near the center of the substrate).

FIG. 1 illustrates conventional laser drilled plated through holes in a thick substrate, in accordance with the prior art. A thick substrate may be a substrate having a thickness that is greater than or equal to 200 μm. As shown in FIG. 1, a printed circuit board 100 may include a layer of substrate 102 (i.e., a dielectric such as FR4) through which one or more vias may be drilled. Although not shown explicitly, most finished PCBs 100 include multiple layers of dielectric material, conductive material (e.g., copper), and/or reinforcement material (e.g., woven glass). As is known in the art, vias may be of different types including, but not limited to, through vias, blind vias, buried vias, and stacked vias.

As shown in FIG. 1, the substrate 102 includes three copper-filled vias 104 laser-drilled through the substrate 102. The necking phenomenon 114 is illustrated as the diameter of the holes decreases towards the center of the substrate. Conventional laser drilling techniques utilize two opposing lasers on either side of the substrate 102, which causes the hole diameter of the vias to reduce to a minimum at approximately the middle of the substrate 102. In addition, copper-filled vias may contain voids 112 due to imperfections of the copper filling process. The voids 112 tend to migrate within the copper material when current passes through the material. If the voids 112 migrate to the surface of the substrate layer, the voids 112 may cause disconnections at the interface of the vias. Thus, there is a need for addressing this issue and/or other issues associated with the prior art.

SUMMARY

A process for manufacturing a printed circuit board having high-density microvias formed in a thick substrate is disclosed. The method includes the steps of forming one or more holes in a thick substrate using a laser drilling technique, electroplating the one or more holes with a conductive material, wherein the conductive material does not completely fill the one or more holes, and filling the one or more plated holes with a non-conductive material.

DETAILED DESCRIPTION

Currently, high-density, copper-filled microvias having diameters less than approximately 100 μm are limited to substrates less than a threshold thickness (e.g., ≤200 μm). Substrates having a thickness greater than this threshold thickness experience reliability issues due to necking of the laser-drilled hole and/or voids formed in the copper fill material of the microvias. The technique described below alleviates some of these issues.

Figure 1:
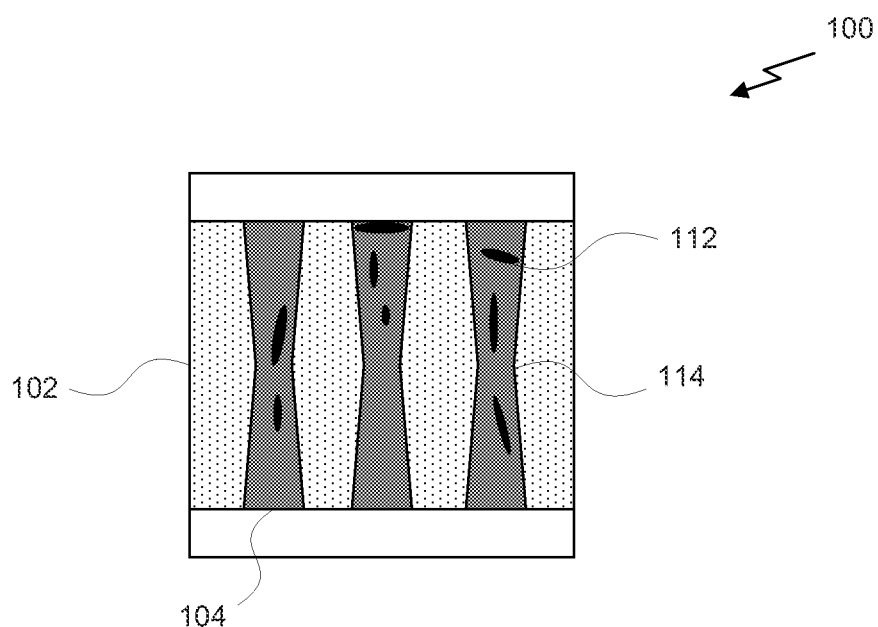
FIG. 1 illustrates conventional laser drilled plated through holes in a thick substrate, in accordance with the prior art.
Figure 2:
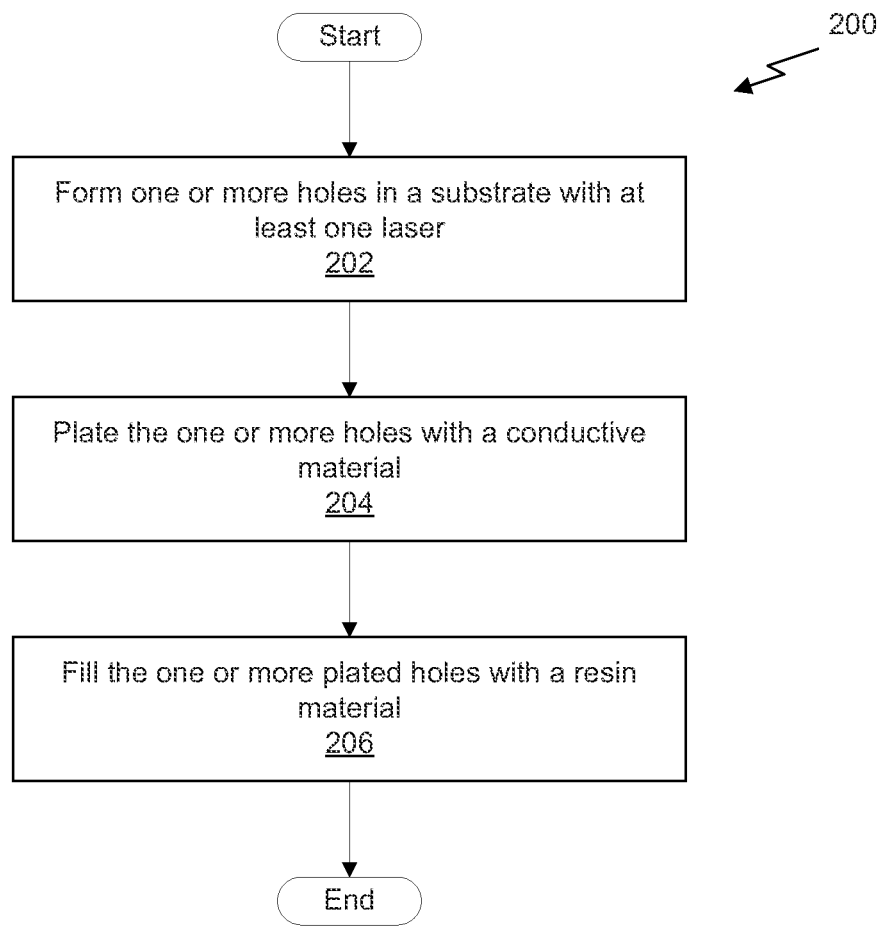
FIG. 2 illustrates a flowchart of a method for forming high density microvias in a thick substrate, in accordance with one embodiment.

FIG. 2 illustrates a flowchart of a method 200 for forming high density microvias in a thick substrate, in accordance with one embodiment. At step 202, one or more holes are formed in a substrate by one or more lasers. In one embodiment, the one or more holes may be through holes formed by two opposing lasers on two sides of the substrate. In another embodiment, the one or more holes may be a through hole formed by a laser located on one side of the substrate. In yet another embodiment, the one or more holes may be blind holes formed by a laser located on one side of the substrate. The substrate may be a single layer of dielectric material or may be multiple layers of materials including dielectric material, conducting material, and reinforcing material.

At step 204, the one or more holes are plated with a conductive material. In one embodiment, the holes formed by the one or more lasers are plated with a thin layer of copper. The thickness of the layer may be less than or equal to approximately 25% of the hole diameter. For example, a hole having a diameter of 100 μm may be plated with a layer of copper between 10 μm and 20 μm thick, leaving a plated hole between 60 μm and 80 μm in diameter that is unfilled. In another embodiment, the conductive material may be a silver-conductive ink. In yet other embodiments, other types of conductive materials may be used, such as gold, silver, or nickel. At step 206, the plated hole is filled with a non-conductive material. In one embodiment, the non-conductive material may be, but is not limited to, one of ABF (Ajinomoto Build-up Film), Epoxy resin, or other types of dielectrics. In one embodiment, the surface of the substrate may be processed prior to filling the plated holes with the non-conductive material to desmear the surface of the plated through holes. Desmearing removes potential contaminates created during drilling and plating. Typically, desmearing may be performed using alkaline permanganate, plasma, or a combination of alkaline permanganate and plasma.

It should be noted that, while various optional features are set forth herein in connection with the technique for forming high-density microvias, such features are for illustrative purposes only and should not be construed as limiting in any manner.

Figure 3A:
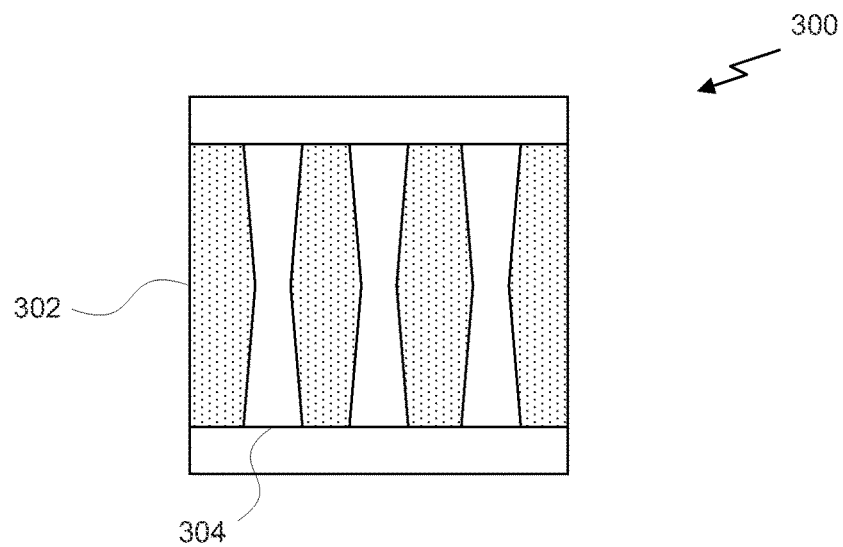
FIG. 3A illustrates a PCB after a drilling process that forms one or more holes therein, in accordance with one embodiment.

FIG. 3A illustrates a PCB 300 after a drilling process that forms one or more holes 304 therein, in accordance with one embodiment. The PCB 300 comprises a substrate 302 such as a layer of dielectric material; e.g., FR4 (i.e., a grade designation of certain glass reinforced epoxy laminates). Again, substrate 302 may include one or more additional layers of dielectric material and one or more additional layers of conductive material (e.g., copper) formed between adjacent layers of dielectric material or formed on the upper or lower surface of the substrate 302. The holes 304 may be formed by a laser drilling process. Laser drilling allows for smaller hole diameters (i.e., ≤100 μm) and better hole 304 to pad (not explicitly shown in FIG. 3A) registration, which is required for tighter design rules of high density microvias. As shown in FIG. 3A, the laser drilling process may include two lasers directed at opposing surfaces of the substrate 302 and oriented approximately coaxially such that the lasers form through holes 304 approximately equally from both surfaces of the substrate 302. In another embodiment, the laser drilling process may include a single laser directed one of the opposing surfaces of the substrate 302 and oriented along an axis that is approximately coaxial with a normal to the surface of the substrate 302. The single laser may be utilized, using different process parameters such as strength and wavelength of the laser and drilling time to drill through holes through both surfaces of the substrate 302 or blind holes to an approximate depth from the surface of the substrate 302.

It will be appreciated that, as shown in FIG. 3A, the holes 304 exhibit the same necking issue discussed when using laser drilling techniques to form holes in a thick substrate. While the method 200 implements conventional laser drilling techniques for forming the holes in the thick substrate, the additional process steps of method 200 reduce the occurrence of failures due to the necking structure of the hole when compared with microvias that have been laser drilled in a thick substrate and completely filled with copper or another conductive material.

In one embodiment, the laser drilling process may be supplemented with a mechanical drilling process that isn't susceptible to as high a failure rate as with a purely mechanical drilling of small diameter vias. The laser-drilled holes 304 may be re-drilled using a mechanical drill bit, reamer, or boring tool to remove the additional material and create a more uniform hole diameter throughout the depth of the hole 304. Although the additional step of cleaning up the holes 304 formed via the laser drilling technique may add expense to the manufacture of the PCB 300, forming a more uniform hole may result in less failures and more reliable parts. Performing the initial step of laser drilling removes a majority of the substrate material from the hole 304 and locates the hole precisely based on the placement of the laser. Mechanical drill bits are prone to wander when drilling through a substrate, which affects the accuracy of hole placement. In addition, small diameter mechanical drill bits may break due to high stress loads placed on the drill bit. However, re-drilling a hole formed by laser drilling may reduce the loads on the mechanical drill bit (i.e., because less material is being removed) such that failures of the drill bit are less likely to occur. Finally, small diameter reamers or boring tools may be structurally stronger than a similarly sized drill bit because they are not designed to remove a large amount of material from the hole like drill bits are. Again, even if the laser drilling process results in necking of the hole 304, the plating and fill techniques of method 200 reduce the occurrence of failures due to necking such that, in some embodiments, the supplemental mechanical drilling step may be skipped to manufacture cheaper products.

Figure 3B:
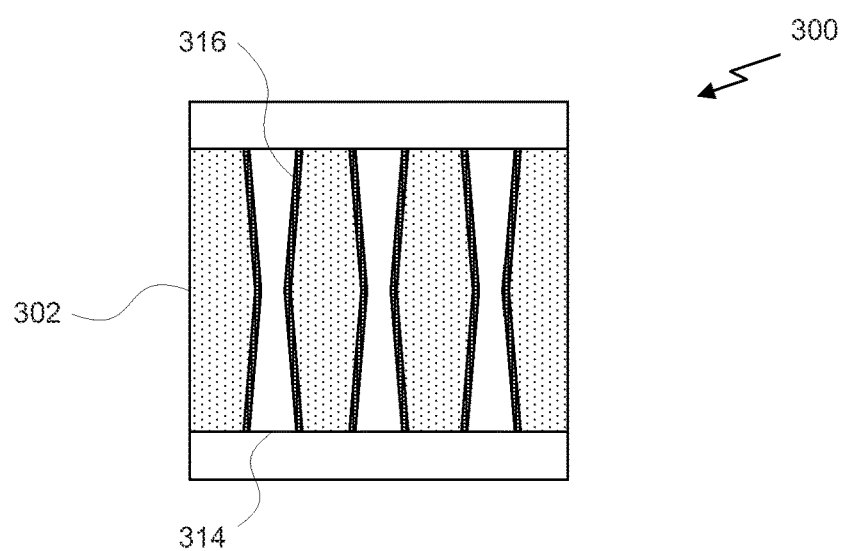
FIG. 3B illustrates the PCB after a plating process has been performed to plate the surface of the holes with a layer of conductive material, in accordance with one embodiment.

FIG. 3B illustrates the PCB 300 after a plating process has been performed to plate the surface of the holes 304 with a layer of conductive material 316, in accordance with one embodiment. After the holes 304 have been formed according to the process described above in conjunction with FIG. 3A, the holes 304 may be plated with a layer of conductive material 316 such as copper. In one embodiment, copper is deposited onto the surfaces of the PCB 300 using an electrolytic plating technique. The process parameters of the electrolytic plating technique may be adjusted to deposit a thin layer of conductive material on the inner surface of the hole 304. In one embodiment, the thickness of the layer of conductive material 316 is approximately 10 μm. The thickness of the layer of conductive material 316 may be adjusted, per the desires of a user, by changing the process parameters, such as a time that the PCB 300 is submerged in the electroplating bath. In one embodiment, the diameter of the plated hole 314 that remains after the plating process should be at least half the diameter of the original hole 304 (i.e., the thickness of the conductive material should be less than or equal to one quarter the diameter of the hole 304).

Optionally, a desmear process may be performed after plating of the holes 304. Unlike conventional techniques which completely fill the hole 304 with copper, because the holes 304 are only plated with a thin layer of conductive material 316, the tape shape for the desmear process does not need to be centered on the hole. This enables a longer desmear time to be utilized to make the inner surface of the plated hole 314 as straight as possible.

Figure 3C:
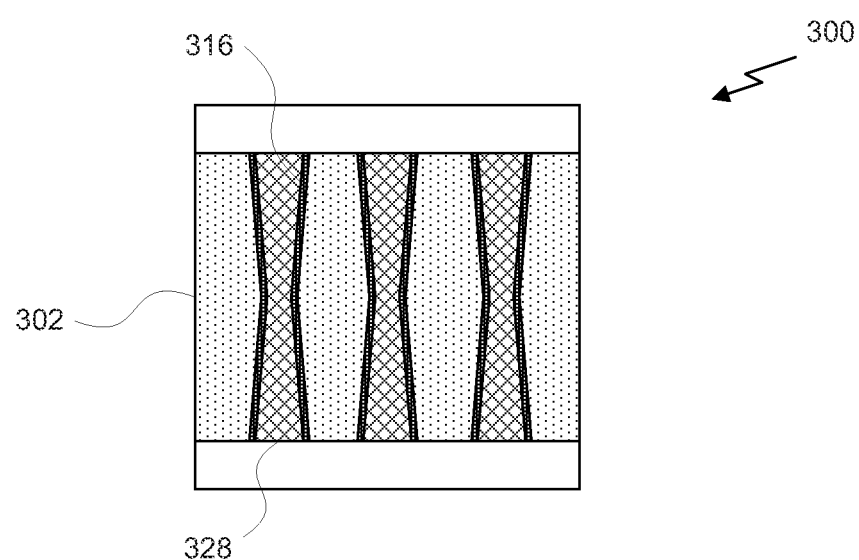
FIG. 3C illustrates the PCB after a filling process has been performed to fill the plated hole with a non-conductive material, in accordance with one embodiment.

FIG. 3C illustrates the PCB 300 after a filling process has been performed to fill the plated hole 314 with a non-conductive material 328, in accordance with one embodiment. The non-conductive material may be an ABF material, an Epoxy resin, or the like. Filling the plated hole 314 with the non-conductive material 328 may have advantages over a complete copper fill. For example, the non-conductive material 328 may be cheaper than the materials used in electrolytic plating, the non-conductive material 328 may be associated with an easier manufacturing process than electrolytic plating, the non-conductive material 328 may not be prone to the same types of failures as the copper fill material; specifically, fracturing at the necking location of the hole and the forming of voids within the filled microvia during filling. For example, an ABF material may be much cheaper than copper fill material (both in the base material and materials used in the respective processes), and the ABF material does not have the same aspect ratio limitations of the copper filling process. In effect, utilizing an ABF (or other non-conductive material 328) may allow a thicker core with tighter design rules.

Figure 4:
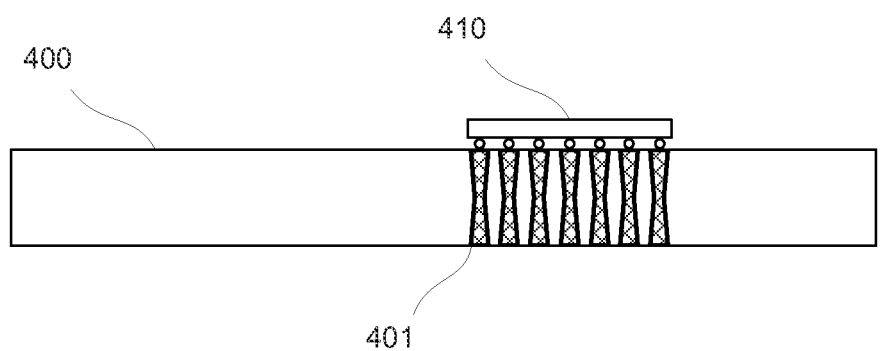
FIG. 4 illustrates a PCB populated with electrical components, in accordance with one embodiment.

FIG. 4 illustrates a PCB 400 populated with electrical components, in accordance with one embodiment. The PCB 400 includes a plurality of microvias 401 formed therein. The microvias 401 may be formed according to the technique for forming high density microvias in a thick substrate. The PCB 400 may include one or more dielectric layers, reinforcing layers, and conducting layers. The PCB 400 may have, soldered thereto, one or more electrical components. In one embodiment, the one or more electrical components include a processor 410 configured to be attached to pads on the surface of the PCB 400. As shown in FIG. 4, the processor 410 is included within a Ball Grid Array (BGA) package and attached to the PCB 410 through the BGA. In other embodiments, the processor 410 may be included in some other type of package configuration. The pads of the PCB 400 coupled to the processor may include via-in-pad (VIP) technology using microvias formed via the technique for forming high density microvias in a thick substrate, described above. The PCB 400 may also include one or more additional electrical components such as memory, capacitors, resistors, ASICs, physical interfaces, and the like (not explicitly shown in FIG. 4).

Figure 5:
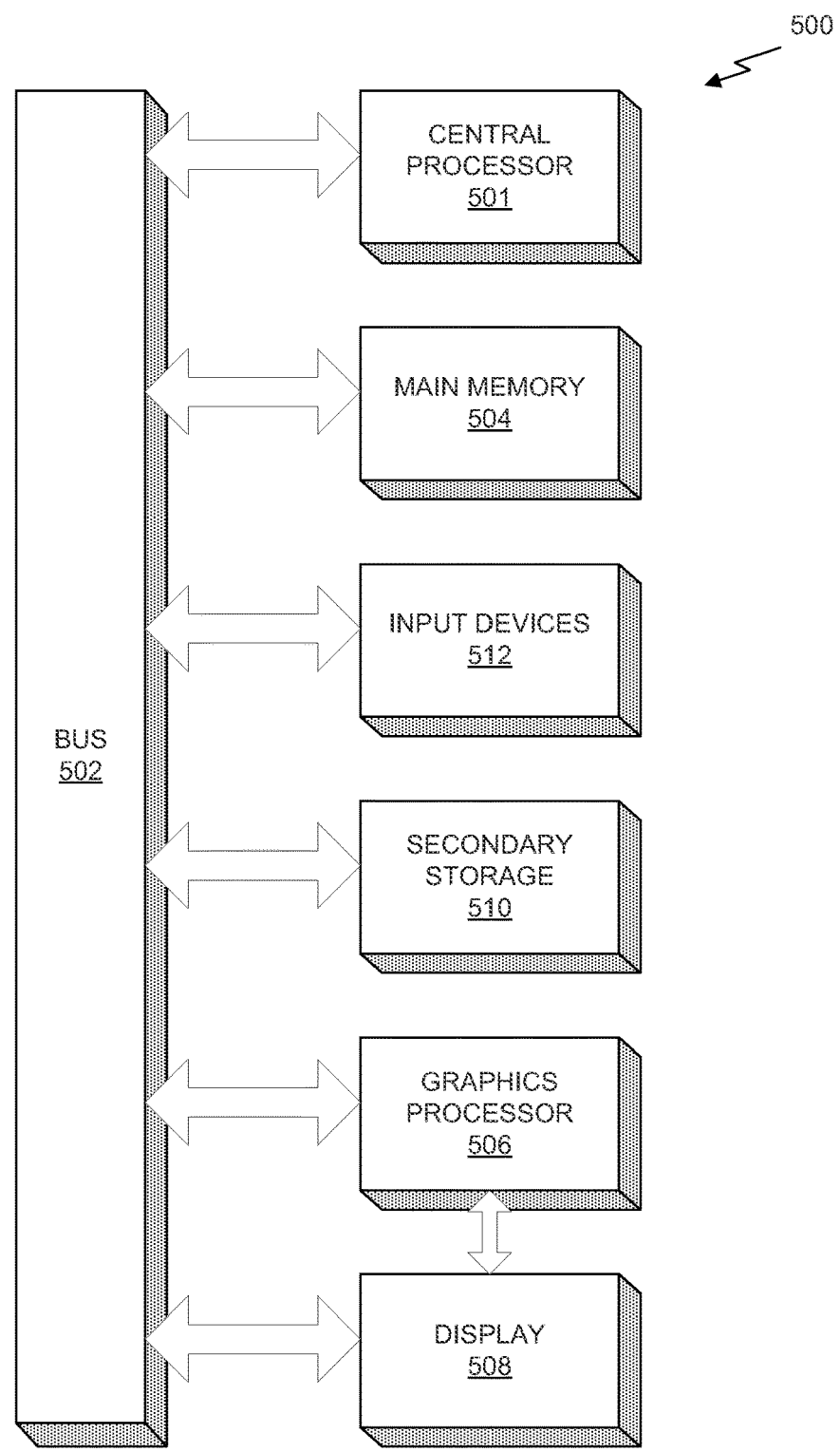
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one central processor 501 that is connected to a communication bus 502. The communication bus 502 may be implemented using any suitable protocol, such as PCI (Peripheral Component Interconnect), PCI-Express, AGP (Accelerated Graphics Port), HyperTransport, or any other bus or point-to-point communication protocol(s). The system 500 also includes a main memory 504. Control logic (software) and data are stored in the main memory 504 which may take the form of random access memory (RAM).

The system 500 also includes input devices 512, a graphics processor 506, and a display 508, i.e. a conventional CRT (cathode ray tube), LCD (liquid crystal display), LED (light emitting diode), plasma display or the like. User input may be received from the input devices 512, e.g., keyboard, mouse, touchpad, microphone, and the like. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 may also include a secondary storage 510. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 504 and/or the secondary storage 510. Such computer programs, when executed, enable the system 500 to perform various functions. The memory 504, the storage 510, and/or any other storage are possible examples of computer-readable media.

In one embodiment, the architecture and/or functionality of the various previous figures may be implemented in the context of the central processor 501, the graphics processor 506, an integrated circuit (not shown) that is capable of at least a portion of the capabilities of both the central processor 501 and the graphics processor 506, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, laptop computer, server, workstation, game consoles, embedded system, and/or any other type of logic. Still yet, the system 500 may take the form of various other devices including, but not limited to a personal digital assistant (PDA) device, a mobile phone device, a television, etc.

Further, while not shown, the system 500 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
forming one or more holes in a thick substrate using a laser drilling technique, wherein forming the one or more holes in the thick substrate comprises activating a first laser on a first side of the thick substrate and activating a second laser on a second side of the thick substrate, wherein an axis of the first laser is substantially coaxial with an axis of the second laser and each hole in the one or more holes has a diameter that is less than 100 μm;
re-forming the one or more holes formed via the laser drilling technique via a mechanical process;
electroplating the one or more holes with a conductive material, wherein the conductive material does not completely fill the one or more holes; and
filling the one or more plated holes with a non-conductive material,
wherein the thick substrate comprises a dielectric layer having a thickness greater than or equal to 200 μm.

2. The method of claim 1, wherein the conductive material is copper.

3. The method of claim 1, wherein the non-conductive material is Ajinomoto Build-up Film (ABF).

4. The method of claim 1, wherein the non-conductive material is an epoxy resin.

5. The method of claim 1, wherein the thick substrate further comprises one or more additional layers of material.

6. The method of claim 5, wherein the one or more additional layers of material include one or more layers of copper and one or more layers of dielectric.

7. The method of claim 1, further comprising desmearing the one or more holes after the electroplating and prior to the filling.

8. The method of claim 7, wherein the desmearing process comprises submerging the substrate in an alkaline permanganate bath.

9. The method of claim 1, wherein the mechanical process is selected from the group consisting of drilling using a drill bit, reaming using a reaming bit, or boring using a boring bit.

10. The method of claim 1, wherein the one or more holes comprise a plurality of high-density microvias.

11. The method of claim 1, wherein at least one of the one or more holes is a through hole.

12. A method, comprising:
    forming one or more holes in a thick substrate using a laser drilling technique, wherein each hole in the one or more holes has a diameter that is less than 100 μm;
    re-forming the one or more holes formed via the laser drilling technique via a mechanical process;
    electroplating the one or more holes with a conductive material, wherein the conductive material does not completely fill the one or more holes;
    desmearing the one or more holes after the electroplating; and
    filling the one or more plated holes with a non-conductive material after the desmearing,
    wherein the thick substrate comprises a dielectric layer having a thickness greater than or equal to 200 μm.

13. The method of claim 12, wherein the conductive material is copper.

14. The method of claim 12, wherein the non-conductive material is Ajinomoto Build-up Film (ABF).

15. The method of claim 12, wherein the non-conductive material is an epoxy resin.

16. The method of claim 12, wherein forming the one or more holes in the thick substrate comprises activating a first laser on a first side of the substrate and activating a second laser on a second side of the substrate, wherein an axis of the first laser is substantially coaxial with an axis of the second laser.

17. The method of claim 12, wherein the thick substrate further comprises one or more additional layers of material.

18. The method of claim 17, wherein the one or more additional layers of material include one or more layers of copper and one or more layers of dielectric.

19. The method of claim 12, wherein the desmearing process comprises submerging the substrate in an alkaline permanganate bath.

20. The method of claim 12, wherein the mechanical process is selected from the group consisting of drilling using a drill bit, reaming using a reaming bit, or boring using a boring bit.

21. The method of claim 12, wherein the one or more holes comprise a plurality of high-density microvias.

22. The method of claim 12, wherein at least one of the one or more holes is a through hole.

* * * * *